United States Patent
Bao et al.

(10) Patent No.: US 11,496,706 B2
(45) Date of Patent: Nov. 8, 2022

(54) SERIALIZER

(71) Applicant: LONTIUM SEMICONDUCTOR CORPORATION, Anhui (CN)

(72) Inventors: Shenghui Bao, Anhui (CN); Jin Su, Anhui (CN); Hui Bian, Anhui (CN); Xinrun Xing, Anhui (CN); Lei Li, Anhui (CN)

(73) Assignee: LONTIUM SEMICONDUCTOR CORPORATION, Anhui (CN)

( * ) Notice: Subject to any disclaimer, the term of this patent is extended or adjusted under 35 U.S.C. 154(b) by 0 days.

(21) Appl. No.: 17/410,907

(22) Filed: Aug. 24, 2021

(65) Prior Publication Data

US 2022/0224857 A1  Jul. 14, 2022

(30) Foreign Application Priority Data

Jan. 11, 2021  (CN) .......................... 202110032426.5

(51) Int. Cl.
  *H04N 5/38* (2006.01)
  *H03M 9/00* (2006.01)

(52) U.S. Cl.
  CPC ............... *H04N 5/38* (2013.01); *H03M 9/00* (2013.01)

(58) Field of Classification Search
  CPC .......... H04N 5/38; H04N 5/067; H03M 9/00; G09G 5/006; G09G 5/008; H04L 25/03019; H04L 25/03057; H04L 25/03343
  USPC ......... 348/723; 345/519, 520; 375/295, 232, 375/233; 725/118, 148; 455/43
  See application file for complete search history.

(56) References Cited

U.S. PATENT DOCUMENTS

| 8,315,303 | B1* | 11/2012 | Chana | ................. H04L 25/4902 375/296 |
| 2008/0063129 | A1* | 3/2008 | Voutilainen | ........... H03L 7/0802 375/376 |
| 2015/0206273 | A1* | 7/2015 | Jeon | ....................... G09G 5/006 348/521 |

* cited by examiner

*Primary Examiner* — Sherrie Hsia
(74) *Attorney, Agent, or Firm* — Harness, Dickey & Pierce, P.L.C.

(57) ABSTRACT

A serializer includes: an I2C controller, an I2C command analysis circuit, a system control circuit, a low-speed data transmission circuit, a high-speed data conversion circuit, a low-speed data processing circuit, a parallel-serial conversion bidirectional circuit, a serial-parallel conversion circuit, a protocol analysis circuit, a video data processing circuit and an I2C receiver. The serializer can receive the external control command from the external controller through the I2C controller, and can also receive the external control command and the internal control command through the parallel-serial conversion bidirectional circuit. In addition, the serializer can also receive the video data from the external video source through the serial-parallel conversion circuit, and receive the audio data from the external source through the I2C receiver. Therefore, the serializer in the present disclosure can be applied to both two application scenarios, which is more flexible in application.

3 Claims, 3 Drawing Sheets

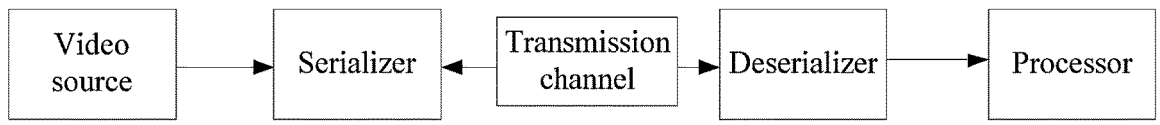
Figure 1(a) -- Prior Art --
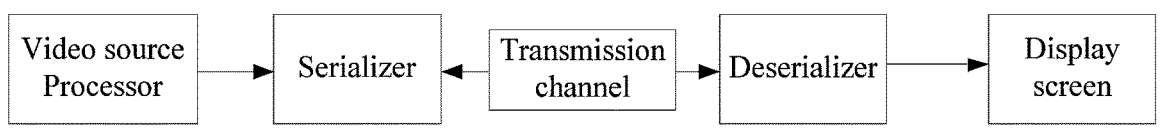
Figure 1(b) -- Prior Art --
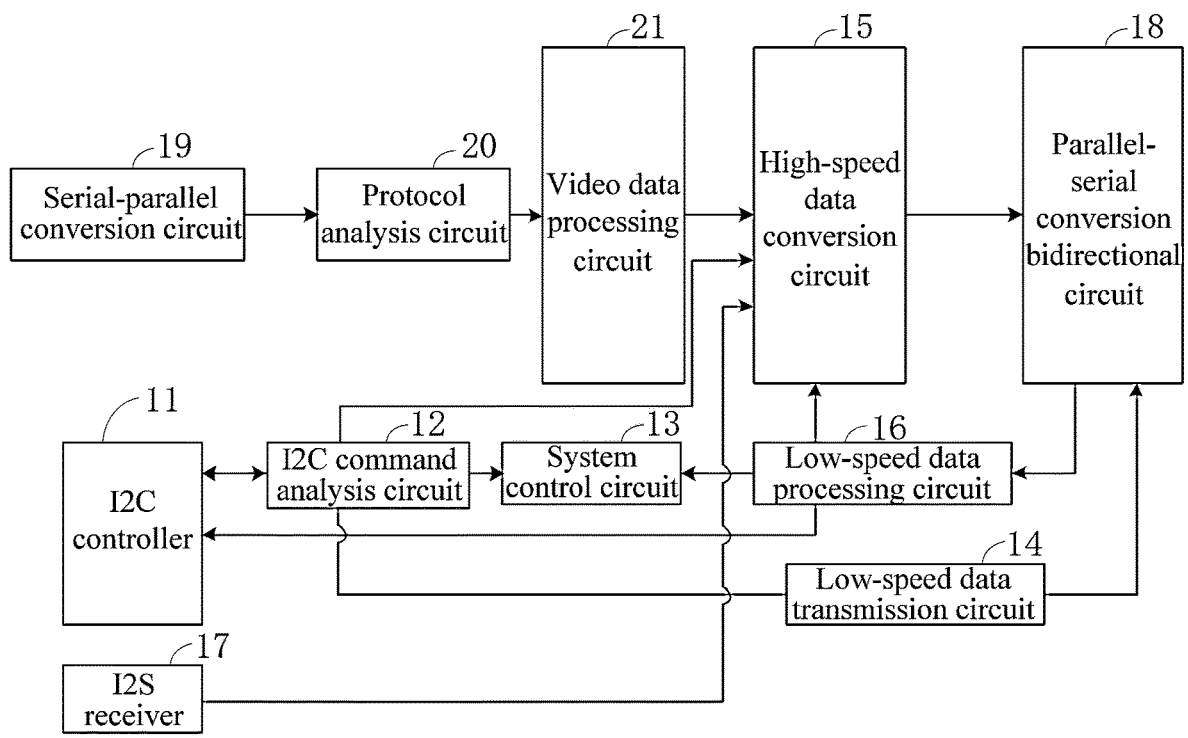
Figure 2

SERIALIZER

The present application claims priority to Chinese Patent Application No. 202110032426.5, titled "SERIALIZER", filed on Jan. 11, 2021 with the China National Intellectual Property Administration, which is incorporated herein by reference in its entirety.

FIELD

The present disclosure relates to the field of communication technology, and in particular to a serializer.

BACKGROUND

Usually video data collected by a video source is processed by a processor and then is displayed on a display screen. In practical applications, a serializer and a deserializer are usually set on a transmission channel to realize transmission of the video data, when an installation distance between the video source and the processor is long, or when an installation distance between the processor and the display screen is long.

FIG. 1(a) is a schematic diagram of a transmission path of video data. The video source may be a camera installed at the rear of the vehicle to obtain rearward image of the vehicle, and the processor may be a central control system inside the vehicle. Since the video source is set at the rear of the vehicle that is far away from the processor, the video source and the processor cannot be directly connected to transmit the video data. It is necessary to add an additional module between the video source and the processor to realize long-distance transmission of the video data. In the traditional solution, a serializer and a deserializer are added between the video source and the processor. When the system is powered on, the video source, the serializer, and the deserializer cannot work directly, which all need to be configured by the processor. Generally, an I2C (Inter Integrated Circuit, built-in integrated circuit) interface is applied for the configuration. As shown in FIG. 1(a), the deserializer is at a proximal end of the processor, which can be directly connected through the I2C interface for configuration. The camera and the serializer are at a distal end of the processor, which cannot be connected directly through the I2C interface. In this case, the deserializer processes an I2C command, and sends the processed I2C command to the serializer through a transmission channel. The serializer analyzes and processes the I2C command to configure the serializer and the video source. The configuration content for the serializer includes: an operation mode and an operation parameter of the serializer. The configuration content for the video source includes: general configuration of the video source to make the video source operate normally. FIG. 1(b) is a schematic diagram of another transmission path of video data. The video source and the processor are at the proximal end, and a display screen is at the distal end. In this case, the transmission data further includes audio data. The processor and the serializer can be directly connected through the I2C interface, and the deserializer and the display can be directly connected through the I2C interface. The processor sends an I2C command to the deserializer at the distal end through the serializer, and the deserializer analyzes the I2C command and then performs configuration.

In the conventional technical, it is necessary to adopt serializers with different internal structures for the two video data transmission situations shown in FIG. 1(a) and FIG. 1(b), which results in the limitation of the application of the serializer.

SUMMARY

In view of this, a serializer is provided according to the present disclosure, which can be applied to all application scenarios, thereby making the application of the serializer more flexible.

A serializer includes: an Inter Integrated Circuit (I2C) controller, an I2C command analysis circuit, a system control circuit, a low-speed data transmission circuit, a high-speed data conversion circuit, a low-speed data processing circuit, a parallel-serial conversion bidirectional circuit, a serial-parallel conversion circuit, a protocol analysis circuit, a video data processing circuit and an Integrated Interchip Sound (I2S) receiver;

the I2C controller is connected to the I2C command analysis circuit; and the I2C controller is configured to receive an external control command from an external controller, and send the external control command to the I2C command analysis circuit;

the I2C command analysis circuit is respectively connected to the system control circuit, the low-speed data transmission circuit, and the high-speed data conversion circuit; and the I2C command analysis circuit is configured to analyze the external control command, determine whether the external control command includes a serializer identifier; send the external control command to the system control circuit if the external control command includes the serializer identifier, generate a first response command, and feedback the first response command to the I2C controller; and send the external control command to the low-speed data transmission circuit and the high-speed data conversion circuit at the same time if the external control command does not include the serializer identifier;

the system control circuit is connected to the low-speed data processing circuit; and the system control circuit is configured to perform an initial configuration on the serializer according to configuration information contained in the external control command, and perform an initial configuration on the serializer according to configuration information contained in an internal control command sent by the low-speed data processing circuit;

the low-speed data transmission circuit is connected to the parallel-serial conversion bidirectional circuit; and the low-speed data transmission circuit is configured to forward the external control command sent by the I2C command analysis circuit to the parallel-serial conversion bidirectional circuit;

the serial-parallel conversion circuit is configured to receive a video data from an external video source, and convert the video data from a serial signal to a parallel signal that is identifiable for the serializer;

the protocol analysis circuit is connected to the serial-parallel conversion circuit; and the protocol analysis circuit is configured to receive video data in a form of the parallel signal, and perform protocol analysis on the video data in the form of the parallel signal, to obtain protocol-analyzed video data;

the video data processing circuit is respectively connected to the protocol analysis circuit and the high-speed data conversion circuit; and the video data processing circuit is configured to receive the protocol-analyzed video data from the protocol analysis circuit, and process the protocol-analyzed video data according to a preset unified format to obtain target video data, and send the target video data to the high-speed data conversion circuit;

the I2S receiver is connected to the high-speed data conversion circuit, and the I2S receiver is configured to receive audio data from an external source and send the audio data to the high-speed data conversion circuit;

the parallel-serial conversion bidirectional circuit is respectively connected to the low-speed data processing circuit and the low-speed data transmission circuit; and the parallel-serial conversion bidirectional circuit is configured to when the high-speed data conversion circuit is not working, switch an operation mode to a low-speed mode, receive low-speed data from outside the serializer and forward the low-speed data to the low-speed data processing circuit, or send low-speed data sent by the low-speed data transmission circuit to an external device of the serializer; the parallel-serial conversion bidirectional circuit is further configured to when the high-speed data conversion circuit is working, switch the operation mode to a high-speed mode, receive high-speed data from the high-speed data conversion circuit and the low-speed data from outside the serializer, and send the low-speed data to the low-speed data processing circuit;

the low-speed data processing circuit is connected to the high-speed data conversion circuit, and the low-speed data processing circuit is configured to in a case that the low-speed data received by the parallel-serial conversion bidirectional circuit from outside the serializer and sent to inside the serializer is an internal control command of the serializer, send the internal control command to the system control circuit, generate a second response command, and send the second response command to the high-speed data conversion circuit; and the low-speed data processing circuit is further configured to in a case that the low-speed data sent by the parallel-serial conversion bidirectional circuit is an external control command of the serializer, send the external control command to the I2C controller, generate a third response command, and send the third response command to the high-speed data conversion circuit; and in a case that the low-speed data sent by the parallel-serial conversion bidirectional circuit is a fourth response command of the I2C controller, send the fourth response command to the I2C controller, wherein the fourth response command is sent to an external device of the serializer by the I2C controller; and the high-speed data conversion circuit is connected to the parallel-serial conversion bidirectional circuit, and the high-speed data conversion circuit is configured to reorganize the target video data, the audio data, the external control command, the second response command and the third response command to obtain high-speed data, and send the high-speed data to the parallel-to-serial conversion bidirectional circuit.

Optionally, the low-speed data processing circuit includes: a low-speed data analysis circuit and a low-speed data receiving circuit;

the low-speed data receiving circuit is respectively connected to the parallel-serial conversion bidirectional circuit and the low-speed data analysis circuit; the low-speed data receiving circuit is configured to receive the low-speed data from the parallel-serial conversion bidirectional circuit, and forward the low-speed data to the low-speed data analysis circuit; and the low-speed data analysis circuit is respectively connected to the high-speed data conversion circuit, the system control circuit, and the I2C controller; and the low-speed data analysis circuit is configured to in a case that the low-speed data is the internal control command of the serializer, send the internal control command to the system control circuit, generate the second response command and send the second response command to the high-speed data conversion circuit; in a case that the low-speed data is the external control command of the serializer, send the external control command to the I2C controller, generate the third response command and send the third response command to the high-speed data conversion circuit; and in a case that the low-speed data is the fourth response command of the I2C controller, send the fourth response command to the I2C controller, wherein the fourth response command is sent to the external device of the serializer by the I2C controller.

Optionally, the protocol analysis circuit includes: a low voltage differential signaling (LVDS) protocol analysis circuit, a transistor-transistor logic (TTL) protocol analysis circuit, a mobile industry processor interface (MIPI) protocol analysis circuit and a selector;

the LVDS protocol analysis circuit is connected to the serial-parallel conversion circuit; and is configured to analyze the video data in the form of the parallel signal sent by the serial-parallel conversion circuit according to LVDS protocol to obtain analyzed video data;

the TTL protocol analysis circuit is connected to the serial-parallel conversion circuit; and is configured to analyze the video data in the form of the parallel signal sent by the serial-parallel conversion circuit according to TTL protocol to obtain analyzed video data;

the MIPI protocol analysis circuit is connected to the serial-parallel conversion circuit; and is configured to analyze the video data in the form of the parallel signal sent by the serial-parallel conversion circuit according to MIPI protocol to obtain analyzed video data; and the selector is respectively connected to the LVDS protocol analysis circuit, the TTL protocol analysis circuit, the MIPI protocol analysis circuit, and the video data processing circuit; and the selector is configured to configure a connection state of paths to the LVDS protocol analysis circuit, the TTL protocol analysis circuit and the MIPI protocol analysis circuit according to initialization configuration information sent by the system control circuit.

Based on the above technical solutions, a serializer is provided according to the present disclosure, which includes: an I2C controller, an I2C command analysis circuit, a system control circuit, a low-speed data transmission circuit, a high-speed data conversion circuit, a low-speed data processing circuit, a parallel-serial conversion bidirectional circuit, a serial-parallel conversion circuit, a protocol analysis circuit, a video data processing circuit and an I2S receiver. The I2C controller receives an external control command from an external controller. The I2C command analysis circuit analyzes the external control command, and sends the external control command to the system control circuit if it is determined that the external control command includes a serializer identifier, and simultaneously sends the external control command to the low-speed data transmission circuit and the high-speed data conversion circuit if it is determined that the external control command does not include the serializer identifier. The system control circuit performs an initial configuration on the serializer according to configuration information contained in the external control command or configuration information contained in an internal control command sent by the low-speed data processing circuit. Video data sent by an external video source is converted into a parallel signal by the serial-parallel conversion circuit, and is analyzed by the protocol analysis circuit and processed by the video data processing circuit, to obtain target video data. The high-speed data conversion circuit reorganizes the target video data, the external control command, audio data sent by the I2S receiver, a second response command and a third response command generated by the low-speed data processing circuit, to obtain high-speed data; and sends the high-speed data to the parallel-serial conversion bidirectional circuit when the low-speed data processing circuit is in a high-speed mode. The parallel-serial conversion bidirectional circuit can also receive low-speed data and send the low-speed data to the low-speed data processing circuit. If the low-speed data is an internal control command of the serializer, the low-speed data processing circuit sends the internal control command to the system control circuit. If the low-speed data is an external control command of the serializer, the low-speed data processing circuit sends the external control command to the I2C controller. The low-speed data includes: the low-speed data sent by the low-speed data transmission circuit (the low-speed data at this time must be an external control command, and can be forwarded to the external device of the serializer by the parallel-serial conversion bidirectional circuit) and the low-speed data received from outside the serializer when the high-speed data conversion circuit is not working; or the low-speed data received from outside the serializer when the high-speed data conversion circuit is working. It can be seen that the serializer in the present disclosure can receive the external control command sent by the external controller through the I2C controller, and can also receive the external control command and the internal control command through the parallel-serial conversion bidirectional circuit. In addition, the serializer can also receive the video data sent by the external video source through the serial-parallel conversion circuit, and receive the audio data from the external source through the I2C receiver. Therefore, the serializer in the present disclosure can be applied to both the two application scenarios shown in the background, which is more flexible in application.

BRIEF DESCRIPTION OF THE DRAWINGS

In order to clearly describe the technical solutions in the embodiments of the present disclosure, drawings to be used in the description of the embodiments or in the conventional technology are briefly described hereinafter. It is apparent that the drawings described below show merely some embodiments of the present disclosure. Those skilled in the art may obtain other drawings according to the provided drawings without any creative effort.

FIG. 1(a) is a schematic diagram of a transmission path of video data in the conventional solution;

FIG. 1(b) is a schematic diagram of another transmission path of video data in the conventional solution;

FIG. 2 is a structural schematic diagram of a serializer according to an embodiment of the present disclosure;

DETAILED DESCRIPTION OF EMBODIMENTS

Figure 3:
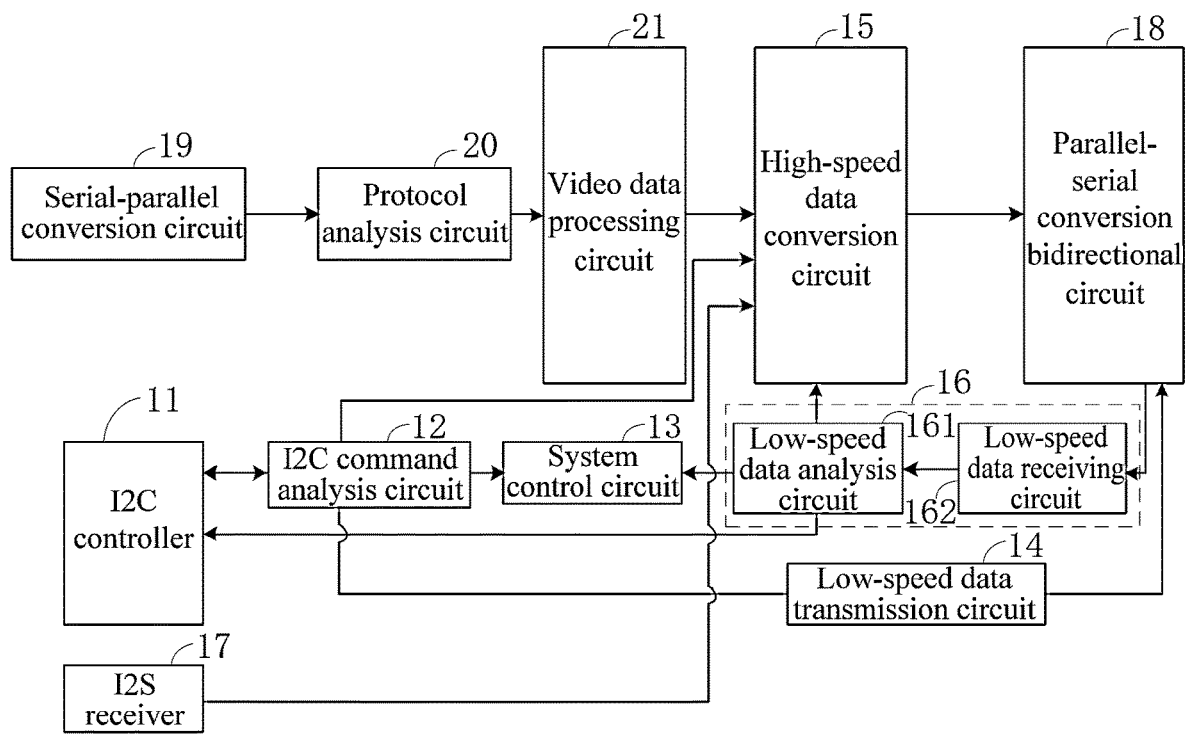
FIG. 3 is a structural schematic diagram of a serializer according to another embodiment of the present disclosure.

For clearer illustration of the technical solutions according to embodiments of the present disclosure, the drawings involved in description of the embodiments according to the present disclosure are briefly described hereinafter. Apparently, the drawings in the following descriptions only a part of the embodiments of the present disclosure, rather than all the embodiments. Other embodiments obtained by those skilled in the art based on the embodiments of the present disclosure without any inventive efforts fall within the protection scope of the present disclosure.

To better understanding the technical solutions of the present disclosure, English abbreviations involved in the present disclosure are explained in the following:

LVDS: Low Voltage Differential Signaling, which is a specific video transmission protocol in the industry;

TTL: Transistor-Transistor Logic, which is a specific video transmission protocol in the industry;

MIPI: Mobile Industry Processor Interface, which is a specific video transmission protocol in the industry;

I2S: Inter IC Sound, integrated circuit built-in audio bus, which is a specific audio transmission protocol in the industry;

I2C: Inter Integrated Circuit, which is a specific communication protocol in the industry, the host is a transmitting end of commands, the slave is a receiving end of commands, the host can send commands to the slave, and the slave can also reply data to the host according to the command type.

The serializer is provided according to an embodiment of the present disclosure, which can receive the external control command sent by the external controller through the I2C controller, and can also receive the external control command and the internal control command through the parallel-serial conversion bidirectional circuit. In addition, the serializer can also receive the video data from the external video source through the serial-parallel conversion circuit, and receive the audio data from the external source through the I2S receiver. Therefore, the serializer in the present disclosure can be applied to both two application scenarios shown in the background, which is more flexible in application.

Reference is made to FIG. 2, which is a schematic diagram of a serializer according to an embodiment of the present disclosure. The serialzier includes: an I2C controller 11, an I2C command analysis circuit 12, a system control circuit 13, a low-speed data transmission circuit 14, a high-speed data conversion circuit 15, a low-speed data processing circuit 16, a parallel-serial conversion bidirectional circuit 18, a serial-parallel conversion circuit 19, a protocol analysis circuit 20, a video data processing circuit 21 and an I2S receiver 17.

The I2C controller 11 is connected to the I2C command analysis circuit 12. The I2C controller 11 is configured to receive an external control command sent by an external controller, and send the external control command to the I2C command analysis circuit 12.

The I2C command analysis circuit 12 is respectively connected to the system control circuit 13, the low-speed data transmission circuit 14, and the high-speed data conversion circuit 15. The I2C command analysis circuit 12 is configured to analyze the external control command, determine whether the external control command includes a serializer identifier; send the external control command to the system control circuit 13 if the external control command includes the serializer identifier, and generate a first response command and feedback the first response command to the I2C controller 11; and send the external control command to the low-speed data transmission circuit 14 and the high-speed data conversion circuit 15 at the same time if the external control command does not include the serializer identifier.

The system control circuit 13 is connected to the low-speed data processing circuit 16. The system control circuit 13 is configured to perform an initial configuration on the serializer according to configuration information contained in the external control command, and perform an initial configuration on the serializer according to configuration information contained in an internal control command sent by the low-speed data processing circuit 16.

The low-speed data transmission circuit 14 is connected to the parallel-serial conversion bidirectional circuit 18. The low-speed data transmission circuit 14 is configured to forward the external control command sent by the I2C command analysis circuit 12 to the parallel-serial conversion bidirectional circuit 18.

The serial-parallel conversion circuit 19 is configured to receive a video data from an external video source, and convert the video data from a serial signal to a parallel signal that can be identified by the serializer.

The protocol analysis circuit 20 is connected to the serial-parallel conversion circuit 19. The protocol analysis circuit 20 is configured to receive video data in a form of the parallel signal, and perform protocol analysis on the video data in the form of the parallel signal, to obtain protocol-analyzed video data.

The video data processing circuit 21 is respectively connected to the protocol analysis circuit 20 and the high-speed data conversion circuit 15. The video data processing circuit 21 is configured to receive the protocol-analyzed video data from the protocol analysis circuit 20, and process the protocol-analyzed video data according to a preset unified format to obtain target video data, and send the target video data to the high-speed data conversion circuit 15.

The I2S receiver 17 is connected to the high-speed data conversion circuit 15. The I2S receiver 17 is configured to receive an audio data from an external source and send the audio data to the high-speed data conversion circuit 15.

The parallel-serial conversion bidirectional circuit 18 is respectively connected to the low-speed data processing circuit 16 and the low-speed data transmission circuit 14. The parallel-serial conversion bidirectional circuit 18 is configured to switch an operation mode to a low-speed mode when the high-speed data conversion circuit 15 is not working, receive low-speed data from outside the serializer and forward the low-speed data to the low-speed data processing circuit 16, or send low-speed data sent by the low-speed data transmission circuit 14 to an external device of the serializer. The parallel-serial conversion bidirectional circuit 18 is further configured to switch the operation mode to a high-speed mode when the high-speed data conversion circuit 15 is working, receive a high-speed data from the high-speed data conversion circuit 15 and a low-speed data from outside the serializer, and send the low-speed data to the low-speed data processing circuit 16.

The low-speed data processing circuit 16 is connected to the high-speed data conversion circuit 14. The low-speed data processing circuit 16 is configured to when the low-speed data received by the parallel-serial conversion bidirectional circuit 18 from outside the serializer and sent to inside the serializer is an internal control command of the serializer, send the internal control command to the system control circuit 13, generate a second response command and send the second response command to the high-speed data conversion circuit 14. The low-speed data processing circuit 16 is further configured to when the low-speed data sent by the parallel-serial conversion bidirectional circuit 18 is an external control command of the serializer, send the external control command to the I2C controller, generate a third response command and send the third response command to the high-speed data conversion circuit 14; and when the low-speed data sent by the parallel-serial conversion bidirectional circuit 18 is a fourth response command of the I2C controller 11, send the fourth response command to the I2C controller 11, wherein the fourth response command is sent to an external device of the serializer by the I2C controller 11.

The high-speed data conversion circuit 15 is connected to the parallel-serial conversion bidirectional circuit 18. The high-speed data conversion circuit 15 is configured to reorganize the target video data, the audio data, the external control command, the second response command and the third response command to obtain a high-speed data, and send the high-speed data to the parallel-to-serial conversion bidirectional circuit 18.

It can be seen from the above technical solutions that a serializer according to the present disclosure includes: an I2C controller 11, an I2C command analysis circuit 12, a system control circuit 13, a low-speed data transmission circuit 14, a high-speed data conversion circuit 15, a low-speed data processing circuit 16, a parallel-serial conversion bidirectional circuit 18, a serial-parallel conversion circuit 19, a protocol analysis circuit 20, a video data processing circuit 21 and an I2C receiver 17. The I2C controller 11 receives an external control command from an external controller. The I2C command analysis circuit 12 analyzes the external control command, and sends the external control command to the system control circuit 13 if it is determined that the external control command includes a serializer identifier, and simultaneously sends the external control command to the low-speed data transmission circuit 14 and the high-speed data conversion circuit 15 if it is determined that the external control command does not include the serializer identifier. The system control circuit 13 performs an initial configuration on the serializer according to configuration information contained in the external control command or configuration information contained in an internal control command sent by the low-speed data processing circuit 16. Video data sent by an external video source is converted into a parallel signal by the serial-parallel conversion circuit 19, and is analyzed by the protocol analysis circuit 20 and processed by the video data processing circuit 21 to obtain target video data. The high-speed data conversion circuit 15 reorganizes the target video data, the external control command, audio data sent by the I2C receiver 17, a second response command and a third response command generated by the low-speed data processing circuit 16 to obtain high-speed data, and sends the high-speed data to the parallel-serial conversion bidirectional circuit 18 when the low-speed data processing circuit 16 is in a high-speed mode. The parallel-serial conversion bidirectional circuit 18 can also receive low-speed data and send the low-speed data to the low-speed data processing circuit 16. If the low-speed data is an internal control command of the serializer, the low-speed data processing circuit 16 sends the internal control command to the system control circuit 13. If the low-speed data is an external control command of the serializer, the low-speed data processing circuit 16 sends the external control command to the I2C controller 11. The low-speed data includes: the low-speed data sent by the low-speed data transmission circuit 14 and the low-speed data received from outside the serializer when the high-speed data conversion circuit 15 is not working; or, the low-speed data received from outside the serializer when the high-speed data conversion circuit 15 is working. It can be seen that the serializer in the present disclosure can receive the external control command sent by the external controller through the I2C controller 11, and can also receive the external control command and the internal control command through the parallel-serial conversion bidirectional circuit 18. In addition, the serializer can also receive the video data sent by the external video source through the serial-parallel conversion circuit 19, and receive the audio data from the external source through the I2S receiver 17. Therefore, the serializer in the present disclosure can be applied to both two application scenarios shown in the background, which is more flexible in application.

In a preferred embodiment based on the embodiment shown in FIG. 2, FIG. 3 is a structural schematic diagram of a serializer according to another embodiment of the present disclosure. As shown in FIG. 3, the low-speed data processing circuit 16 includes: a low-speed data analysis circuit 161 and a low-speed data receiving circuit 162.

The low-speed data receiving circuit 162 is respectively connected to the parallel-serial conversion bidirectional circuit 18 and the low-speed data analysis circuit 161. The low-speed data receiving circuit 162 is configured to receive the low-speed data from the parallel-serial conversion bidirectional circuit 18, and forward the low-speed data to the low-speed data analysis circuit 161.

The low-speed data sent from the parallel-serial conversion bidirectional circuit 18 to the low-speed data receiving circuit 162 includes: the low-speed data sent by the low-speed data transmission circuit 14 (the low-speed data at this time must be an external control command, and can be forwarded to the external device of the serializer by the parallel-serial conversion bidirectional circuit) and the low-speed data received from outside the serializer when the high-speed data conversion circuit 15 is not working; or the low-speed data received from outside the serializer when the high-speed data conversion circuit 15 is working.

The low-speed data analysis circuit 161 is respectively connected to the high-speed data conversion circuit 15, the system control circuit 13, and the I2C controller 11. The low-speed data analysis circuit 161 is configured to when the low-speed data is the internal control command of the serializer, send the internal control command to the system control circuit 13, generate the second response command and send the second response command to the high-speed data conversion circuit 14; when the low-speed data is the external control command of the serializer, send the external control command to the I2C controller 11, generate the third response command and send the third response command to the high-speed data conversion circuit 14; and when the low-speed data is the fourth response command of the I2C controller 11, send the fourth response command to the I2C controller 11, wherein the fourth response command is sent to the external device of the serializer by the I2C controller 11.

It should be noted that the serializer in the conventional technology can only process video data sent by a single video source, that is, it can only process video source signals with one protocol. In order to solve this problem, an improved protocol analysis circuit 20 is provided according to an embodiment of the present disclosure.

Figure 4:
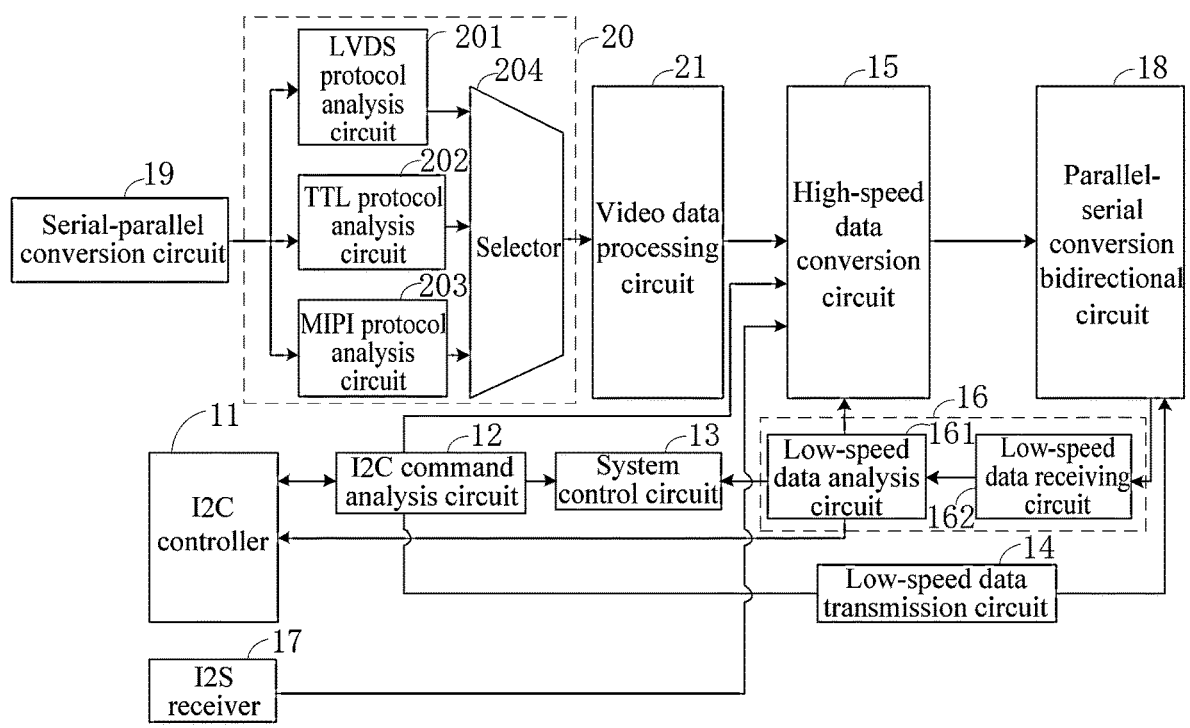
FIG. 4 is a structural schematic diagram of a serializer according to another embodiment of the present disclosure.

Reference is made to FIG. 4, which is a structural schematic diagram of a serializer according to another embodiment of the present disclosure. On the basis of the embodiment shown in FIG. 3, the protocol analysis circuit 20 includes: an LVDS protocol analysis circuit 201, a TTL protocol analysis circuit 202, an MIPI protocol analysis circuit 203, and a selector 204.

The LVDS protocol analysis circuit 201 is connected to the serial-parallel conversion circuit 19. The LVDS protocol analysis circuit 201 is configured to analyze the video data in the form of the parallel signal sent by the serial-parallel conversion circuit 19 according to LVDS protocol to obtain analyzed video data.

The TTL protocol analysis circuit 202 is connected to the serial-parallel conversion circuit 19. The TTL protocol analysis circuit 202 is configured to analyze the video data in the form of the parallel signal sent by the serial-parallel conversion circuit 19 according to TTL protocol to obtain analyzed video data.

The MIPI protocol analysis circuit 203 is connected to the serial-parallel conversion circuit 19. The MIPI protocol analysis circuit 203 is configured to analyze the video data in the form of the parallel signal sent by the serial-parallel conversion circuit 19 according to MIPI protocol to obtain analyzed video data.

The selector 204 is respectively connected to the LVDS protocol analysis circuit 201, the TTL protocol analysis circuit 202, the MIPI protocol analysis circuit 203, and the video data processing circuit 21. The selector 204 is configured to configure a connection state of paths to the LVDS protocol analysis circuit 201, the TTL protocol analysis circuit 202 and the MIPI protocol analysis circuit 203 according to initialization configuration information sent by the system control circuit 13.

It should be further noted that, the relationship terminologies such as "first", "second" and the like are only used herein to distinguish one entity or operation from another, rather than to necessitate or imply that the actual relationship or order exists between the entities or operations. Further, the term "include", "comprise" or any variant thereof is intended to encompass nonexclusive inclusion so that a process, method, article or device including a series of elements includes not only those elements but also other elements which have not been listed definitely or an element (s) inherent to the process, method, article or device. Moreover, the expression "comprising a(n) . . . " in which an element is defined will not preclude presence of an additional identical element(s) in a process, method, article or device comprising the defined element(s) unless further defined.

The embodiments in this specification are described in a progressive manner. Each embodiment lays emphasis on differences from other embodiments. For the same or similar parts between the embodiments, one may refer to the description of other embodiments.

Based on the above description of the embodiments, those skilled in the art are capable of carrying out or using the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. A serializer, comprising: an Inter Integrated Circuit (I2C) controller, an I2C command analysis circuit, a system control circuit, a low-speed data transmission circuit, a high-speed data conversion circuit, a low-speed data processing circuit, a parallel-serial conversion bidirectional circuit, a serial-parallel conversion circuit, a protocol analysis circuit, a video data processing circuit and an Integrated Interchip Sound (I2S) receiver; wherein:
the I2C controller is connected to the I2C command analysis circuit; and the I2C controller is configured to receive an external control command from an external controller, and send the external control command to the I2C command analysis circuit;

the I2C command analysis circuit is respectively connected to the system control circuit, the low-speed data transmission circuit, and the high-speed data conversion circuit; and the I2C command analysis circuit is configured to analyze the external control command, determine whether the external control command includes a serializer identifier; send the external control command to the system control circuit if the external control command includes the serializer identifier, and generate a first response command and feedback the first response command to the I2C controller; and send the external control command to the low-speed data transmission circuit and the high-speed data conversion circuit at the same time if the external control command does not include the serializer identifier;

the system control circuit is connected to the low-speed data processing circuit; and the system control circuit is configured to perform an initial configuration on the serializer according to configuration information contained in the external control command, and perform an initial configuration on the serializer according to configuration information contained in an internal control command sent by the low-speed data processing circuit;

the low-speed data transmission circuit is connected to the parallel-serial conversion bidirectional circuit; and the low-speed data transmission circuit is configured to forward the external control command sent by the I2C command analysis circuit to the parallel-serial conversion bidirectional circuit;

the serial-parallel conversion circuit is configured to receive video data from an external video source, and convert the video data from a serial signal to a parallel signal that is identifiable for the serializer;

the protocol analysis circuit is connected to the serial-parallel conversion circuit; and the protocol analysis circuit is configured to receive the video data in a form of the parallel signal, and perform protocol analysis on the video data in the form of the parallel signal, to obtain protocol-analyzed video data;

the video data processing circuit is respectively connected to the protocol analysis circuit and the high-speed data conversion circuit; and the video data processing circuit is configured to receive the protocol-analyzed video data from the protocol analysis circuit, and process the protocol-analyzed video data according to a preset unified format to obtain target video data, and send the target video data to the high-speed data conversion circuit;

the I2S receiver is connected to the high-speed data conversion circuit, and the I2S receiver is configured to receive audio data from an external source and send the audio data to the high-speed data conversion circuit;

the parallel-serial conversion bidirectional circuit is respectively connected to the low-speed data processing circuit and the low-speed data transmission circuit; the parallel-serial conversion bidirectional circuit is configured to when the high-speed data conversion circuit is not working, switch an operation mode to a low-speed mode, receive low-speed data from outside the serializer and forward the low-speed data to the low-speed data processing circuit, or send low-speed data sent by the low-speed data transmission circuit to an external device of the serializer; and the parallel-serial conversion bidirectional circuit is further configured to when the high-speed data conversion circuit is working, switch the operation mode to a high-speed mode, and receive high-speed data from the high-speed data conversion circuit and low-speed data from outside the serializer, and send the low-speed data to the low-speed data processing circuit;

the low-speed data processing circuit is connected to the high-speed data conversion circuit; and the low-speed data processing circuit is configured to in a case that the low-speed data received by the parallel-serial conversion bidirectional circuit from outside the serializer and sent to the serializer is an internal control command of the serializer, send the internal control command to the system control circuit, generate a second response command and send the second response command to the high-speed data conversion circuit; and the low-speed data processing circuit is further configured to in a case that the low-speed data sent by the parallel-serial conversion bidirectional circuit is an external control command of the serializer, send the external control command to the I2C controller, generate a third response command and send the third response command to the high-speed data conversion circuit; and in a case that the low-speed data sent by the parallel-serial conversion bidirectional circuit is a fourth response command of the I2C controller, send the fourth response command to the I2C controller, wherein the fourth response command is sent to an external device of the serializer by the I2C controller; and the high-speed data conversion circuit is connected to the parallel-serial conversion bidirectional circuit; and the high-speed data conversion circuit is configured to reorganize the target video data, the audio data, the external control command, the second response command and the third response command, to obtain high-speed data, and send the high-speed data to the parallel-to-serial conversion bidirectional circuit.

2. The serializer according to claim 1, wherein the low-speed data processing circuit comprises: a low-speed data analysis circuit and a low-speed data receiving circuit; wherein:

the low-speed data receiving circuit is respectively connected to the parallel-serial conversion bidirectional circuit and the low-speed data analysis circuit, the low-speed data receiving circuit is configured to receive the low-speed data from the parallel-serial conversion bidirectional circuit, and forward the low-speed data to the low-speed data analysis circuit; and the low-speed data analysis circuit is respectively connected to the high-speed data conversion circuit, the system control circuit, and the I2C controller; and the low-speed data analysis circuit is configured to in a case that the low-speed data is the internal control command of the serializer, send the internal control command to the system control circuit, generate the second response command and send the second response command to the high-speed data conversion circuit; in a case that the low-speed data is the external control command of the serializer, send the external control command to the I2C controller, generate the third response command and send the third response command to the high-speed data conversion circuit; and in a case that the low-speed data is the fourth response command of the I2C controller, send the fourth response command to the I2C controller, wherein the fourth response command is sent to the external device of the serializer by the I2C controller.

3. The serializer according to claim 1, wherein the protocol analysis circuit comprises: a low voltage differential signaling (LVDS) protocol analysis circuit, a transistor-transistor logic (TTL) protocol analysis circuit, a mobile industry processor interface (MIPI) protocol analysis circuit and a selector; wherein:

the LVDS protocol analysis circuit is connected to the serial-parallel conversion circuit, and is configured to analyze the video data in the form of the parallel signal sent by the serial-parallel conversion circuit according to LVDS protocol to obtain analyzed video data;

the TTL protocol analysis circuit is connected to the serial-parallel conversion circuit, and is configured to analyze the video data in the form of the parallel signal sent by the serial-parallel conversion circuit according to TTL protocol to obtain analyzed video data;

the MIPI protocol analysis circuit is connected to the serial-parallel conversion circuit, and is configured to analyze the video data in the form of the parallel signal sent by the serial-parallel conversion circuit according to MIPI protocol to obtain analyzed video data; and the selector is respectively connected to the LVDS protocol analysis circuit, the TTL protocol analysis circuit, the MIPI protocol analysis circuit, and the video data processing circuit; and the selector is configured to configure a connection state of paths to the LVDS protocol analysis circuit, the TTL protocol analysis circuit and the MIPI protocol analysis circuit according to initialization configuration information sent by the system control circuit.

\* \* \* \* \*